United States Patent [19]

Otani et al.

[11] Patent Number: 5,708,285
[45] Date of Patent: Jan. 13, 1998

[54] NON-VOLATILE SEMICONDUCTOR INFORMATION STORAGE DEVICE

[75] Inventors: Naoko Otani; Toshiharu Katayama, both of Itami, Japan

[73] Assignee: Mitsubishi Denki Kabushiki Kaisha, Tokyo, Japan

[21] Appl. No.: 526,391

[22] Filed: Sep. 11, 1995

[30] Foreign Application Priority Data

Sep. 13, 1994 [JP] Japan .................. 6-219108

[51] Int. Cl.$^6$ .................................. H01L 29/788
[52] U.S. Cl. .................. 257/315; 257/316; 257/321
[58] Field of Search ............................ 257/315, 316, 257/317, 320, 321, 322, 326

[56] References Cited

U.S. PATENT DOCUMENTS

| | | | |
|---|---|---|---|
| 4,667,217 | 5/1987 | Janning | 257/326 |
| 5,143,860 | 9/1992 | Mitchell et al. | 437/43 |
| 5,168,465 | 12/1992 | Harari | 257/320 |
| 5,463,235 | 10/1995 | Ishii | 257/319 |
| 5,517,044 | 5/1996 | Koyama | 257/317 |
| 5,557,566 | 9/1996 | Ochii | 257/321 |
| 5,559,048 | 9/1996 | Inoue | 257/316 |
| 5,569,946 | 10/1996 | Hong | 257/315 |

FOREIGN PATENT DOCUMENTS

| | | | |
|---|---|---|---|
| 0531707 | 3/1993 | European Pat. Off. | 257/315 |
| 0557581 | 9/1993 | European Pat. Off. | |
| 0590319 | 4/1994 | European Pat. Off. | |
| 57-120297 | 7/1982 | Japan . | |
| 60-065576 | 4/1985 | Japan . | |
| 1161770 | 6/1989 | Japan . | |
| 2104287 | 3/1983 | United Kingdom . | |
| 9304506 | 3/1993 | WIPO . | |
| 94001892 | 1/1994 | WIPO | 257/315 |

*Primary Examiner*—Sara W. Crane
*Assistant Examiner*—Phat X. Cao
*Attorney, Agent, or Firm*—Leydig, Voit & Mayer, Ltd.

[57] ABSTRACT

A non-volatile semiconductor storage device with which a multi-value memory is realized and the amount of information storable is increased without increasing the number of memory transistors and the area occupied thereby. A gate electrode portion 20a of each memory transistor has a two-layer floating gate structure comprising two floating gate electrodes 22a, 22b and a control gate electrode 24 which are substantially vertically laminated one above another. The non-volatile semiconductor storage device is thereby constructed as a multi-value memory capable of providing a state "1" where electrons are injected into the first floating gate electrode 22a, a state "0" where electrons are injected into the first and second floating gate electrodes 22a, 22b, and a state "2" where electrons are withdrawn from the first and second floating gate electrodes 22a, 22b.

4 Claims, 11 Drawing Sheets

NON-VOLATILE SEMICONDUCTOR INFORMATION STORAGE DEVICE

FIELD OF THE INVENTION

The present invention relates to a semiconductor information storage device and, more particularly, to a non-volatile semiconductor information storage device in which information can be electrically written and from which written information can be erased, and a method of manufacturing the semiconductor information storage device.

DESCRIPTION OF THE RELATED ART

An EEPROM (Electrically Erasable and Programmable Read Only Memory) is known as one of several non-volatile semiconductor information storage devices. FIG. 19 is a sectional view of a known EEPROM. In FIG. 19, denoted by reference numeral 100 is an EEPROM, 1 is a silicon substrate, 10 is a drain region including a dopant impurity producing the conductivity type opposite to that of the silicon substrate 1, 11 is a source region including a dopant impurity producing the conductivity type opposite to that of the silicon substrate 1, 12 is a contact region below a contact hole 33 (described later), 20 is a gate electrode including parts 21 to 24 where 21 is a first gate oxide film on the silicon substrate 1, 22 is a floating gate electrode on the first gate oxide film 21, 23 is a second gate insulating film on the floating gate electrode 22, and 24 is a control gate electrode on the second gate insulating film 23. 31 is an interlayer oxide film between the silicon substrate 1 and the gate electrode 20, 32 is an interlayer insulating film on the interlayer oxide film 31, and 33 is a contact hole formed by removing parts of the interlayer insulating film 32 and the interlayer oxide film 31. Further, 40 is aluminum wiring connected to the drain region 10 through the contact hole 33 and the contact region 12, and 50 is a passivation film covering all of a device-defining area on the silicon substrate 1.

The EEPROM 100 includes two memory transistors sharing one source electrode (source region 11) and also sharing respective drain electrodes (drain region 10) with an adjacent pair of memory transistors.

The operation of the EEPROM 100 is described with reference to FIG. 19. The EEPROM operates in a write/erase mode for electrically writing or erasing information, and a read mode for reading information. The write/erase mode includes a write mode for electrically writing information and an erase mode for electrically erasing information.

First, in the erase mode, the drain electrode including the drain region 10 is brought into a floating state, and the control gate electrode 24 is brought into a grounded state. Then, a high voltage of about 12 V is applied to the source electrode including the source region 11. This high voltage causes a Fowler-Nordheim tunnel current (hereinafter referred to as an FN tunnel current) to flow from the source region 11 to the floating gate electrode 22 through a source-side part of the first gate oxide film 21 positioned below an end of the floating gate electrode 22, close to the source region 11. Electrons in the floating gate electrode 22 are withdrawn with the FN tunnel current, thereby erasing information.

Next, in the write mode, the source electrode including the source region 11 is brought into a grounded state, a voltage of about 7 V is applied to the drain electrode including the drain region 10, and a voltage of about 12 V is applied to the control gate electrode 24. Under this condition, there occurs an avalanche phenomenon in the vicinity of the drain region 10 below an opposite end of the floating gate electrode 22. Hot electrons generated by the avalanche phenomenon are injected from the silicon substrate 1 into the floating gate electrode 22 through a drain-side part of the first gate oxide film 21, thereby writing information.

In the read mode, the source electrode including the source region 11 is brought into a grounded state, a voltage of about 1 V is applied to the drain electrode including the drain region 10, and a voltage of about 3 V is applied to the control gate electrode 24. Under this condition, a state of "1" or "0" is determined depending on whether a current not less than a predetermined value, Ids, flows from the drain region 10 to the source region 11, thereby reading information.

FIG. 20 is a graph showing the relationship between gate voltage and drain current. When electrons are present in the floating gate electrode 22, no current flows from the drain region 10 to the source region 11. As a result, the written state, i.e., the state of "0", is read. On the other hand, when electrons are withdrawn from the floating gate electrode 22, a current not less than the predetermined value Ids flows from the drain region 10 to the source region 11. As a result, the erased state, i.e., the state of "1", is read.

A method of manufacturing the known non-volatile semiconductor storage device is described with reference to FIGS. 21 to 28. First, as shown in FIG. 21, the first gate oxide film 21 about 10 nm thick is formed on the silicon substrate 1 by thermal oxidation. Next, as shown in FIG. 22, a polycrystalline silicon layer about 200 nm thick, which will become the floating gate electrode 22, the second gate insulating film 23 about 30 nm thick, and a polycrystalline silicon layer about 300 nm thick, which will become the control gate electrode 24, are successively formed on the first gate oxide film 21 in this order. Then, as shown in FIG. 23, the laminated layers are patterned, using known photolithography and etching techniques, into a desired pattern to form the gate electrodes 20 of the memory transistors, each of which comprises the first gate oxide film 21, the floating gate electrode 22, the second gate insulating film 23, and the control gate electrode 24.

Subsequently, as shown in FIG. 24, As ions are implanted into the silicon substrate 1 in a concentration of about $3 \times 10^{15}/cm^2$ with the gate electrodes 20 used as masks. After that, the implanted impurities are diffused by thermal diffusion to form the source region 11 and the drain region 10.

Next, as shown in FIG. 25, the interlayer oxide film 31 is formed on the gate electrodes 20 and on the silicon substrate 1 in the regions where the gate electrodes 20 are not present. After that, as shown in FIG. 26, the interlayer insulating film 32 is applied over all of a device region. Then, as shown in FIG. 27, parts of the interlayer insulating film 32 and the interlayer oxide film 31 are removed from a position above the drain region 10 to form the contact hole 33.

Next, as shown in FIG. 28, a dopant impurity producing the conductivity type opposite that of the silicon substrate 1 is implanted through each contact hole 33 by ion implantation to form the contact region 12 which prevents aluminum from penetrating through the silicon substrate 1. Then, the aluminum wiring 40 about 1 μm thick, which will become a bit line, is formed in contact with the drain region 10. After that, as shown in FIG. 19, the passivation film 50, 1 μm thick, is formed for device protection, thereby completing a memory chip.

Because the known non-volatile semiconductor information storage device has a structure as described above, the memory transistor is able to store is only two types of information, i.e., the written state "0", in which electrons are present in the floating gate electrode, and the erased state "1", in which electrons are not present in the floating gate electrode. This raises a problem because the quantity of information storable can be increased only by increasing the number of memory transistors and, hence, an increase in the amount of information storable results in a larger size of the information storage device, particularly, a larger area occupied by the information storage device.

SUMMARY OF THE INVENTION

In view of solving the problems as set forth above, an object of the present invention is to provide a non-volatile semiconductor information storage device and a method of manufacturing the information storage device in which the quantity of information storable can be increased without increasing the number of memory transistors and the area occupied.

To achieve the above object, a first aspect of the present invention provides a non-volatile semiconductor information storage device wherein a plurality of memory transistors for electrically writing and erasing information are located on a semiconductor substrate, each of the memory transistors comprising a source electrode and a drain electrode located on a primary surface of a semiconductor substrate as regions having a conductivity type opposite that of the semiconductor substrate; a gate electrode on the semiconductor substrate between the source electrode and the drain electrode and having a two-layer floating gate structure comprising two floating gate electrodes and a control gate electrode laminated on each other; and an erase gate electrode located laterally from the gate electrode.

A second aspect of the present invention provides a non-volatile semiconductor information storage device according to the first aspect of the invention wherein the gate electrode comprises a first gate oxide film, a first floating gate electrode, a second gate insulating film, a second floating gate electrode, a third gate oxide film, a control gate electrode, and a fourth gate oxide film successively laminated on the semiconductor substrate, so that electrons are injected into the first floating gate electrode from the side of the semiconductor substrate through the first gate oxide film and electrons are injected into the second floating gate electrode from the control gate electrode through the third gate oxide film.

A third aspect of the present invention provides a non-volatile semiconductor information storage device according to the first aspect of the invention wherein the gate electrode comprises a first gate oxide film, a first floating gate electrode, a second gate oxide film, a second floating gate electrode, a third gate insulating film, a control gate electrode, and a fourth gate oxide film successively laminated on the semiconductor substrate, so that electrons are injected into the first floating gate electrode from the side of the semiconductor substrate through the first gate oxide film and electrons are injected into the second floating gate electrode from the first floating gate through the second gate oxide film.

A fourth aspect of the present invention provides a method of manufacturing a non-volatile semiconductor information storage device, the method comprising laminating, on a semiconductor substrate, layers of two floating gate electrodes and one control gate electrode, and patterning the laminated layers into a desired pattern to form a gate electrode; forming a source electrode and a drain electrode by ion implantation on respective sides of the gate electrode in the semiconductor substrate; forming an erase gate electrode laterally of the gate electrode; and forming aluminum wiring.

With the first aspect of the present invention, the gate electrode has the two-layer floating gate structure comprising two floating gate electrodes and the control gate electrode laminated on one another, and the storage device stores three kinds of information, i.e., a state "1" where electrons are injected into one floating gate electrode, a state "0" where electrons are injected into the two floating gate electrodes, and a state "2" where electrons are withdrawn from the two floating gate electrodes.

With the second aspect of the present invention, the first and second floating gate electrodes, the control gate electrode, and the insulating film and the oxide film interposed between those electrodes, which comprise the gate electrode, are laminated and, hence, the area of the memory transistor is not increased.

In the third aspect of the present invention, electrons are injected into the first and second floating gate electrodes in the same direction, whereby the relevant electrodes to which voltages are applied and the polarities of the voltages applied are common in the write modes.

In the fourth aspect of the present invention, memory transistors each having the two-layer floating gate structure are easily formed by partly modifying a known manufacturing process.

DETAILED DESCRIPTION OF THE PREFERRED EMBODIMENTS

Embodiment 1

Figure 1:
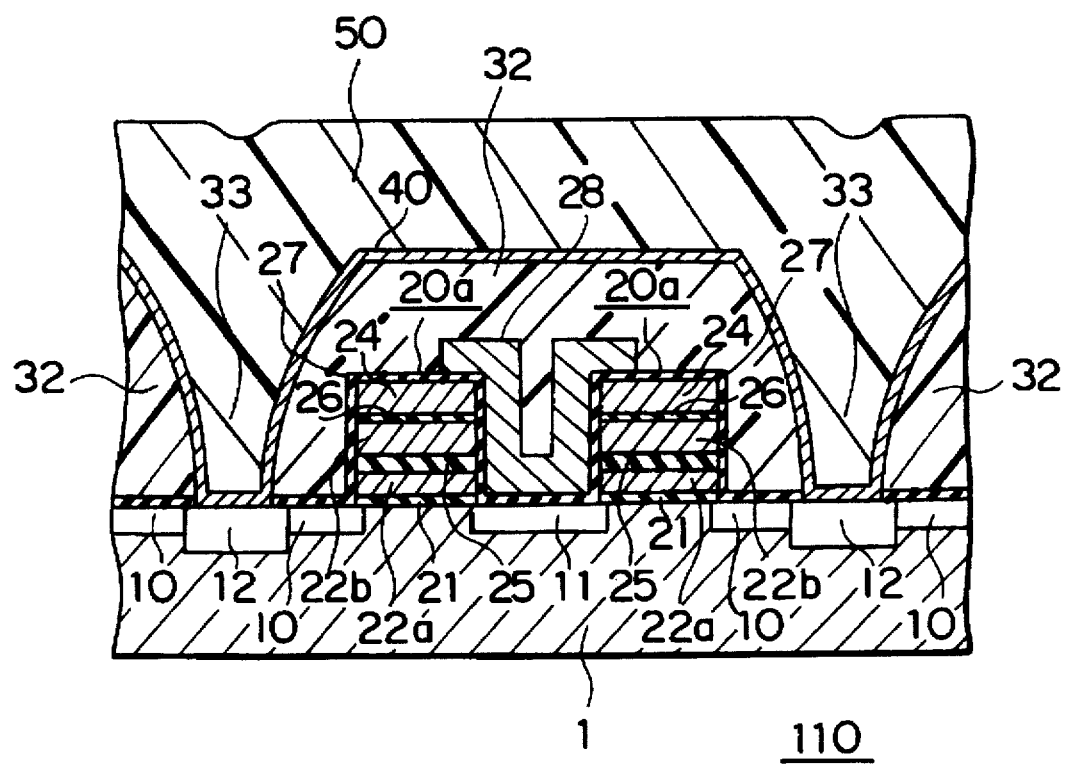
FIG. 1 is a sectional view of an EEPROM according to one embodiment of the present invention.

FIG. 1 is a sectional view of an EEPROM, a non-volatile semiconductor information storage device, according to one embodiment of the present invention. In FIG. 1, reference numeral 110 is an EEPROM, 1 is a silicon substrate, 10 is a drain region including a dopant impurity producing the conductivity type opposite that of the silicon substrate 1, 11 is a source region including a dopant impurity producing the conductivity type opposite that of the silicon substrate 1, and 12 is a contact region containing a dopant impurity and located opposite a contact hole 33 (described later) in the silicon substrate 1.

20a is a gate electrode having a two-layer floating gate structure including parts 21, 22a, 22b, 24, 25, 26, 27, and 28. 21 is a first gate oxide film on the silicon substrate 1. On the first gate oxide film 21, a first floating gate electrode 22a, a second gate insulating film 25, a second floating gate electrode 22b, a third gate oxide film 26, and a control gate electrode 24 are successively laminated in this order. 27 is a fourth gate oxide film on both the silicon substrate 1 and the two-layer floating gate structure, and 28 is an erase gate electrode on the fourth gate oxide film 27, between the twin two-layer floating gate structures.

32 is an interlayer insulating film on both the fourth gate oxide film 27 and the erase gate electrode 28, and 33 is a contact hole formed by removing parts of the interlayer insulating film 32 and the fourth gate oxide film 27. Further, 40 is aluminum wiring connected to the drain region 10 through the contact hole 33 and the contact region 12, and 50 is a passivation film covering all of a device-defining area on the silicon substrate 1.

The EEPROM 110 includes a pair of memory transistors sharing one source electrode (source region 11) and one erase gate electrode (erase gate electrode 28), and also sharing respective drain electrodes (drain regions 10) with an adjacent pair of memory transistors. Each of the memory transistors comprises the gate electrode 20a, the source electrode (source region 11), the drain electrode (drain region 10), and the erase gate electrode (erase gate electrode 28).

The operation of the EEPROM 110 of this embodiment in write/erase modes is described with reference to FIG. 1. First, in the write mode, the source electrode including the source region 11 is brought into a grounded state, and a positive voltage is applied to both the drain electrode including the drain region 10 and the control gate electrode 24. Under this condition, there occurs an avalanche phenomenon in the vicinity of the drain region 10 below an end of the first floating gate electrode 22a. Hot electrons generated by the avalanche phenomenon are injected from the silicon substrate 1 into the first floating gate electrode 22a through a drain-side part of the first gate oxide film 21, thereby writing information. This state where electrons are injected into the first floating gate electrode 22a is assumed to be "1".

Under these conditions, the drain electrode, including the drain region 10, is brought into a grounded state, and a negative high voltage is applied to the control gate electrode 24. This allows an FN tunnel current to flow from the second floating gate electrode 22b to the control gate electrode 24 through the third gate oxide film 26. Electrons are also injected into the second floating gate electrode 22b in the flow of the FN tunnel current. This state where electrons are injected into both the first floating gate electrode 22a and the second floating gate electrode 22b is assumed to be "0". Thus, in the write mode, two kinds of information can be created for each memory transistor (memory cell).

Next, in the erase mode, the drain electrode, including the drain region 10, the control gate electrode 24, and the source electrode, including the source region 11, are brought into a grounded state, while a positive high voltage is applied to the erase gate electrode 28. This allows an FN tunnel current to flow from the erase gate electrode 28 to the first floating gate electrode 22a and the second floating gate electrode 22b through the fourth gate oxide film 27. Electrons in the first and second floating gate electrodes 22a and 22b are withdrawn by the FN tunnel current, thereby erasing information. This state is assumed to be "2".

As described above, the write mode of the EEPROM of this embodiment provides the state "1" where electrons are injected into the first floating gate electrode 22a and the state "0" where electrons are injected into both the first and second floating gate electrodes 22a and 22b, and the erase mode provides the state "2" where electrons are withdrawn from both the first and second floating gate electrodes 22a and 22b. Therefore, three kinds of information, i.e. , "0", "1", and "2", can be stored for each memory transistor (memory cell).

Accordingly, since the EEPROM has a multi-value memory, the amount of information storable can be much increased in comparison with the prior art. Also, since the two floating gate electrodes are laminated in the vertical direction, the number or area of the memory transistors is not increased and, hence, the entire size of the EEPROM (i.e., the area occupied thereby) is not increased.

FIGS. 2 to 12 are sectional views for explaining a process of manufacturing the EEPROM 110 shown in FIG. 1. The method is described below with reference to those drawings.

Figure 2:
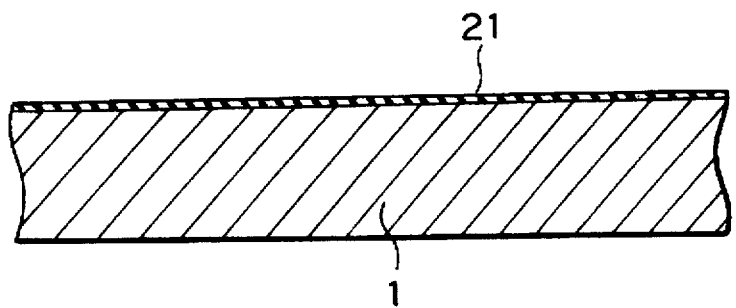
FIG. 2 is a sectional view of a first step in manufacture of the EEPROM of FIG. 1.
Figure 3:
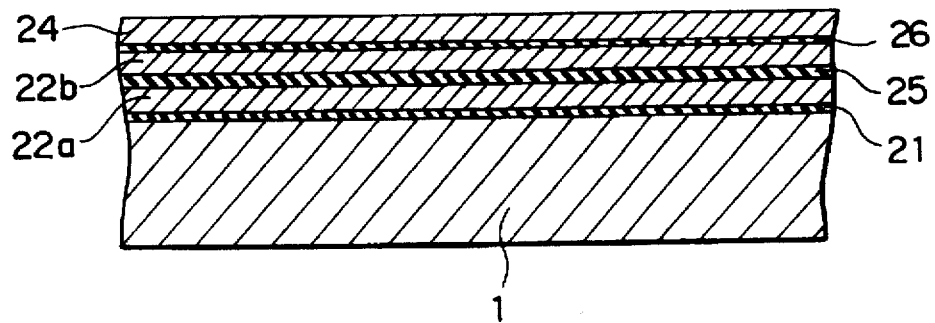
FIG. 3 is a sectional view of a second step in manufacture of the EEPROM of FIG. 1.

First, as shown in FIG. 2, the first gate oxide film 21 about 10 nm thick is formed on the silicon substrate 1 by thermal oxidation. Next, as shown in FIG. 3, a polycrystalline silicon layer about 200 nm thick, which will become the first floating gate electrode 22a, the second gate insulating film 25 about 30 nm thick, a polycrystalline silicon layer about 200 nm thick, which will become the second floating gate electrode 22b, the third gate oxide film 26 about 10 nm thick, and a polycrystalline silicon layer about 300 nm thick, which will become the control gate electrode 24, are successively formed on the first gate oxide film 21 in this order.

Figure 4:
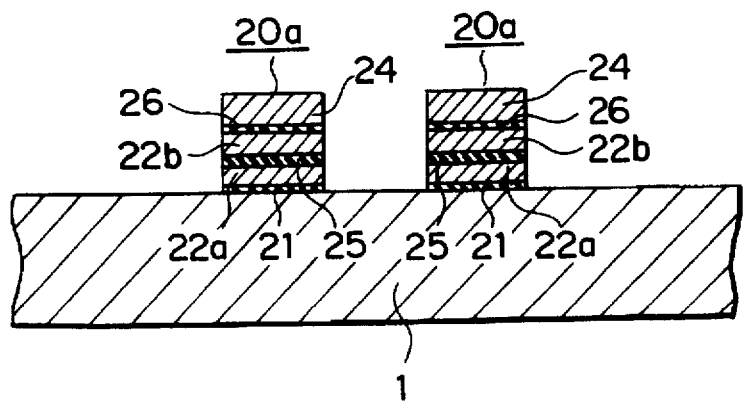
FIG. 4 is a sectional view of a third step in manufacture of the EEPROM of FIG. 1.
Figure 5:
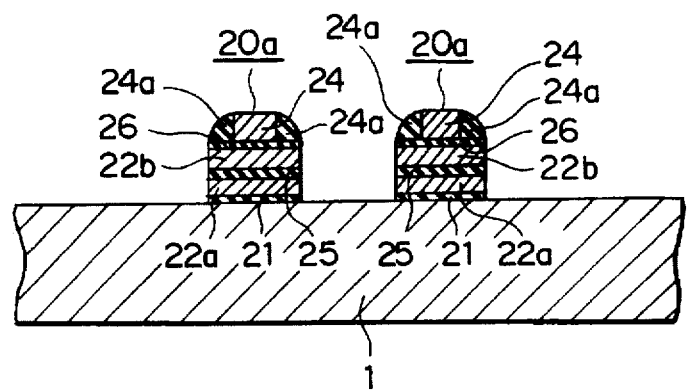
FIG. 5 is a sectional view showing a modification in which side walls are formed for a control gate electrode of the EEPROM of FIG. 1.

Then, as shown in FIG. 4, the laminated layers are patterned, using known photolithography and etching techniques, into a desired pattern to form the gate electrodes 20a, each having the two-layer floating gate structure which comprises the first gate oxide film 21, the first floating gate electrode 22a, the second gate insulating film 25, the second floating gate electrode 22b, the third gate oxide film 26, and the control gate electrode 24. When the breakdown voltage between the erase gate electrode 28 and the control gate electrode 24 is low, side walls 24a of silicon oxide are provided on both sides of the control gate electrode 24, as shown in FIG. 5, after patterning the control gate electrode 24.

Figure 6:
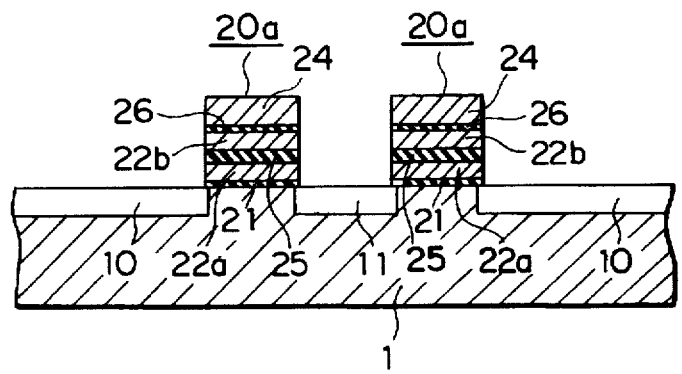
FIG. 6 is a sectional view of a fourth step in the manufacture of the EEPROM of FIG. 1.

Subsequently, as shown in FIG. 6, As ions are implanted into the silicon substrate 1 in a concentration of about $3 \times 10^{15}/cm^2$ with the gate electrodes 20a used as masks. After that, the implanted impurities are diffused by thermal diffusion to form the source region 11 and the drain region 10.

Figure 7:
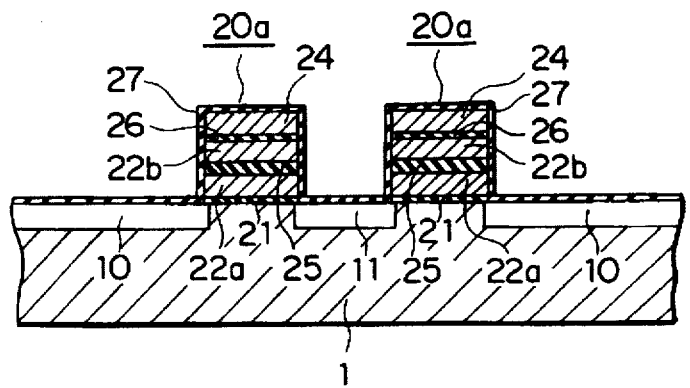
FIG. 7 is a sectional view of a fifth step in the manufacture of the EEPROM of FIG. 1.
Figure 8:
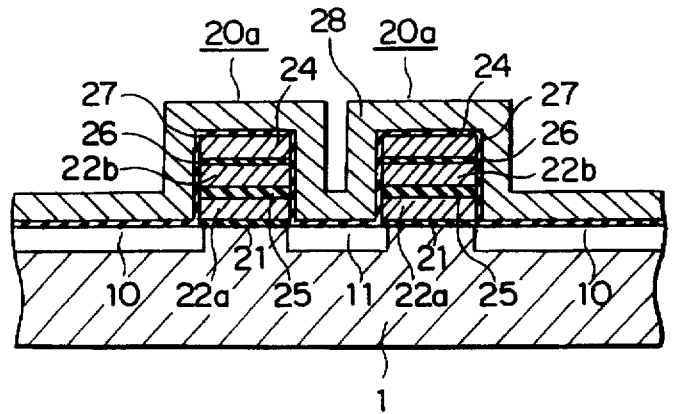
FIG. 8 is a sectional view of a sixth step in the manufacture of the EEPROM of FIG. 1.

Next, as shown in FIG. 7, the fourth gate oxide film 27 about 10 nm thick is formed on the gate electrodes 20a and on the silicon substrate 1 in the regions where the gate electrodes 20a are not present. On the fourth gate oxide film 27, as shown in FIG. 8, a polycrystalline silicon layer about 200 nm thick, which will become the erase gate electrode 28, is formed. After that, as shown in FIG. 9, the polycrystalline silicon layer is patterned using photolithography and etching techniques to form the erase gate electrode 28.

Figure 10:
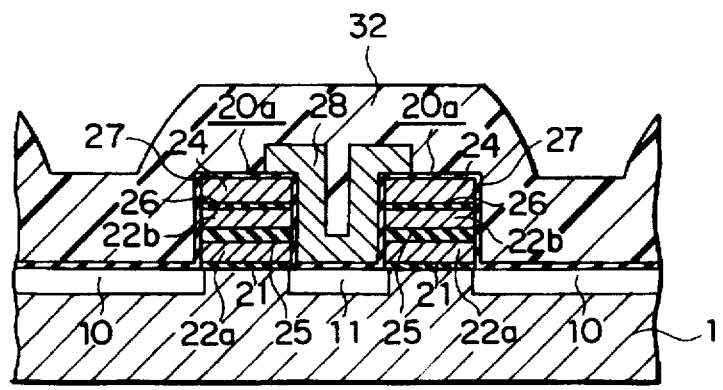
FIG. 10 is a sectional view of an eighth step in the manufacture of the EEPROM of FIG. 1.

Next, as shown in FIG. 10, the interlayer insulating film 32 is applied, covering all of a device region. Then, as shown in FIG. 11, parts of the interlayer insulating film 32 and the fourth gate oxide film 27 are removed at a position opposite the drain region 10 to form the contact hole 33.

Figure 12:
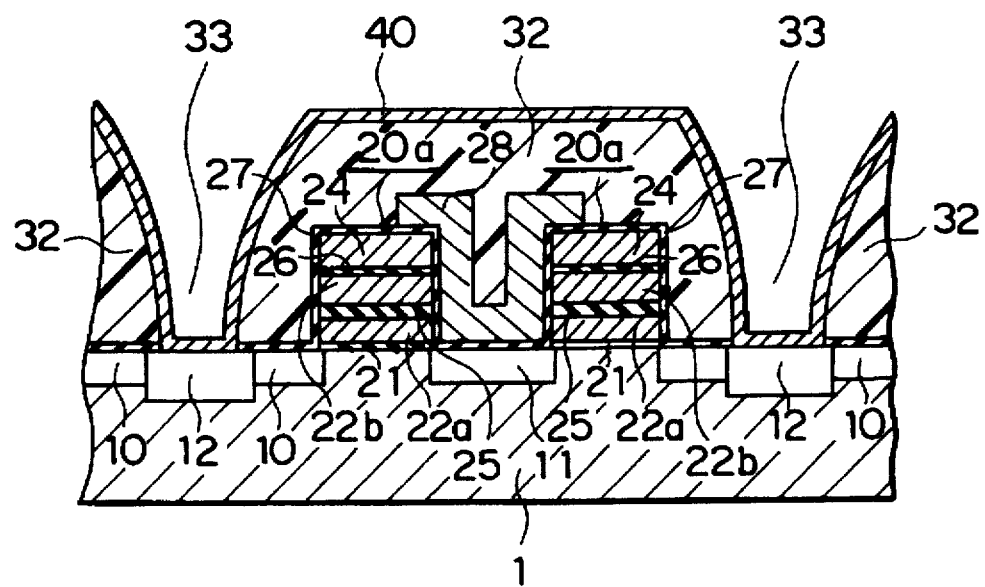
FIG. 12 is a sectional view of a tenth step in the manufacture of the EEPROM of FIG. 1.

Next, as shown in FIG. 12, a dopant impurity producing the conductivity type opposite that of the silicon substrates 1 is implanted through each contact hole 33 to form the contact region 12 which prevents aluminum of the later-described aluminum wiring 40 from penetrating through the silicon substrate 1. Then, the aluminum wiring 40 about 1 μm thick, which will become a bit line, is formed in contact with the drain region 10. After that, as shown in FIG. 1, the passivation film 50 about 1 μm thick is formed for device protection, thereby completing a memory chip.

Figure 9:
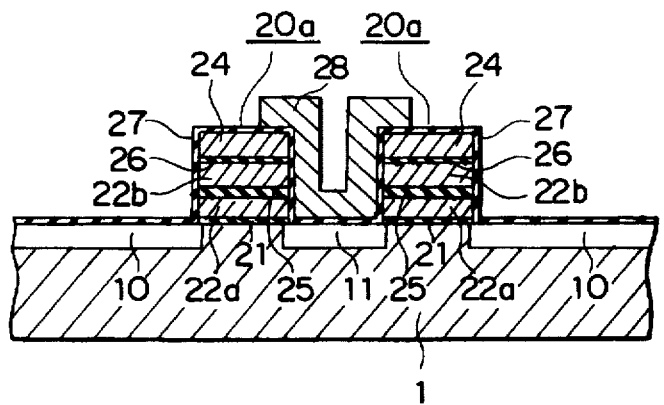
FIG. 9 is a sectional view of a seventh step in the manufacture of the EEPROM of FIG. 1.
Figure 11:
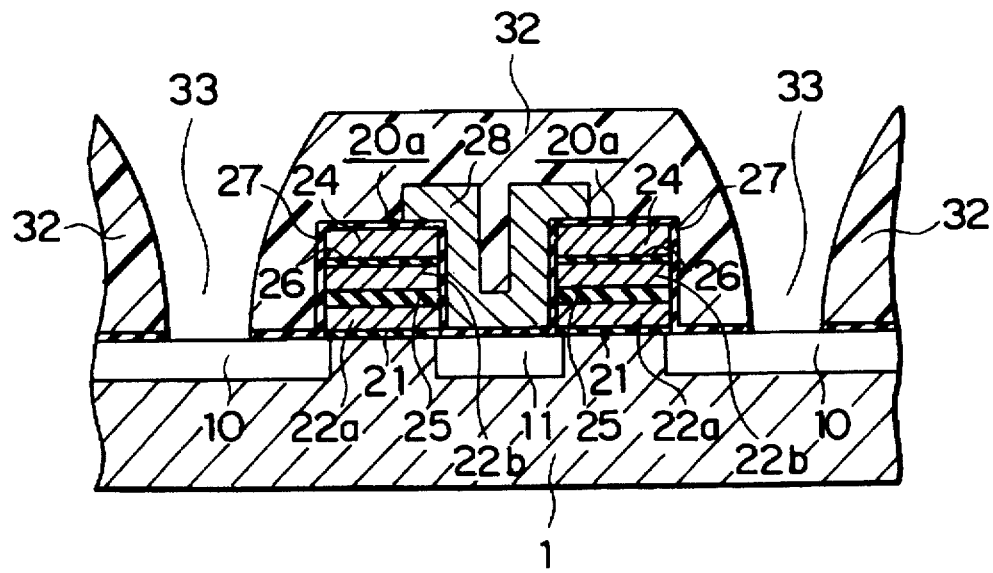
FIG. 11 is a sectional view of a ninth step in the manufacture of the EEPROM of FIG. 1.

FIGS. 2 to 5 correspond to a gate electrode forming step, FIG. 6 corresponds to a source/drain electrode forming step, FIGS. 7 to 9 correspond to an erase gate electrode forming step, and FIGS. 10 to 12 correspond to a wiring forming step. In the method of this embodiment, as described above, memory transistors each having the two-layer floating gate structure can easily be formed by partly modifying the known process. As a result, an existing manufacturing facility can be used and, hence, the production cost can be held down.

Embodiment 2

Figure 13:
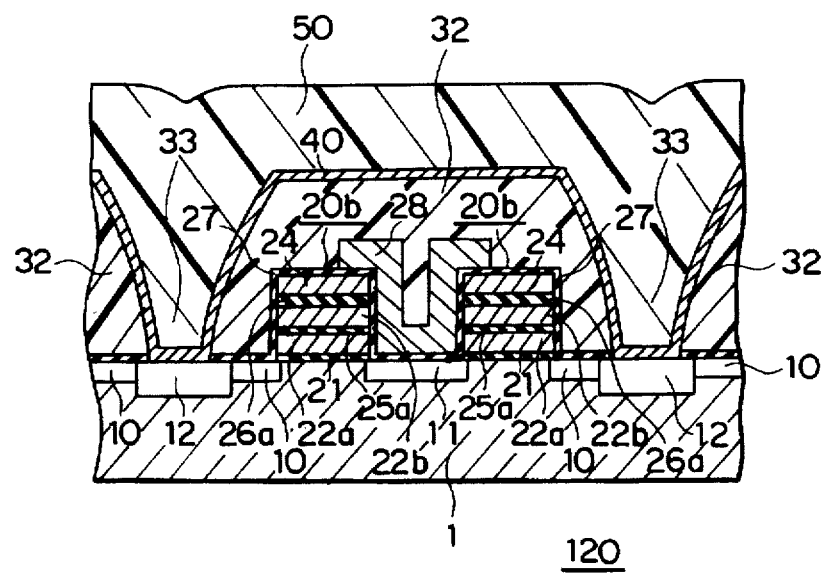
FIG. 13 is a sectional view of an EEPROM according to another embodiment of the present invention.

FIG. 13 is a sectional view of an EEPROM, a non-volatile semiconductor information storage device, according to another embodiment of the present invention. An EEPROM 120 of FIG. 13 is greatly different from the EEPROM 110 of Embodiment 1 in the two-layer floating gate structure of a gate electrode 20b.

In the gate electrode 20a of Embodiment 1, a thick second gate insulating film 25 having a high degree of insulation is disposed between the first floating gate electrode 22a and the second floating gate electrode 22b, and a thin third gate oxide film 26 having a low degree of insulation is provided between the second floating gate electrode 22b and the control gate electrode 24. By contrast, in the gate electrode 20b of this Embodiment 2, a thin second gate oxide film 25a having a low degree of insulation is disposed between the first and second floating gate electrodes 22a and 22b, and a thick third gate insulating film 26a having a high degree of insulation is disposed between the second floating gate electrode 22b and the control gate electrode 24. In the write/erase modes, electrons are injected into and withdrawn from the floating gate electrodes 22a and 22b in directions different from those in Embodiment 1. Additionally, Embodiment 2 is different from Embodiment 1 in the thicknesses of the films. Details are described below.

The operation of the EEPROM 120 of this embodiment in write/erase modes is described with reference to FIG. 13. First, in the write mode, the source electrode including the source region 11 is brought into a grounded state, and a positive voltage is applied to both the drain electrode, including the drain region 10 and the control gate electrode 24. Under this condition, there occurs an avalanche phenomenon in the vicinity of the drain region 10 below an end of the first floating gate electrode 22a. Hot electrons generated by the avalanche phenomenon are injected from the silicon substrate 1 into the first floating gate electrode 22a through a drain-side part of the first gate oxide film 21, thereby writing information. This state where electrons are injected into the first floating gate electrode 22a is assumed to be "1".

Then, with the voltage conditions being continuously maintained, an FN tunnel current flows from the second floating gate electrode 22b to the first floating gate electrode 22a through the second gate oxide film 25a. Electrons are also injected into the second floating gate electrode 22b by the FN tunnel current. This state where electrons are injected into both the first floating gate electrode 22a and the second floating gate electrode 22b is assumed to be "0". Thus, in the write mode, two kinds of information can be created for each memory transistor (memory cell).

Next, in the erase mode, the drain electrode including the drain region 10, the control gate electrode 24, and the source electrode, including the source region 11, are brought into a grounded state, while a positive high voltage is applied to the erase gate electrode 28. This condition causes an FN tunnel current to flow from the erase gate electrode 28 to the first floating gate electrode 22a and the second floating gate electrode 22b through the fourth gate oxide film 27. Electrons in the first and second floating gate electrodes 22a and 22b are withdrawn by the FN tunnel current, thereby erasing information. This state is assumed to be "2".

As described above, the write mode of the EEPROM of this embodiment also provides the state "1" where electrons are injected into one floating gate electrode 22a and the state "0" where electrons are injected into two floating gate electrodes 22a and 22b, and the erase mode provides the state "2" where electrons are withdrawn from the two floating gate electrodes 22a and 22b. Therefore, three kinds of information, i.e., "0", "1" and "2", can be stored for each memory transistor (memory cell).

Accordingly, since the EEPROM has a multi-value memory, the amount of information storable can be much increased in comparison with the prior art memory. Also, the number or area of the memory transistors is not increased and, hence, the entire size of the EEPROM (i.e., the area occupied) is not increased.

Further, in the write mode of the EEPROM 110 of Embodiment 1, it is required to change the polarities of voltages applied to the relevant electrodes in the state "1" when changing to the state "0". However, in the write mode of the EEPROM 120 of this embodiment, since the relevant electrodes to which voltages are applied and the polarities of the voltages applied are the same in creating the state "1" and creating the state "0", information can more simply and quickly be written and the operating speed of the EEPROM can be increased.

Figure 14:
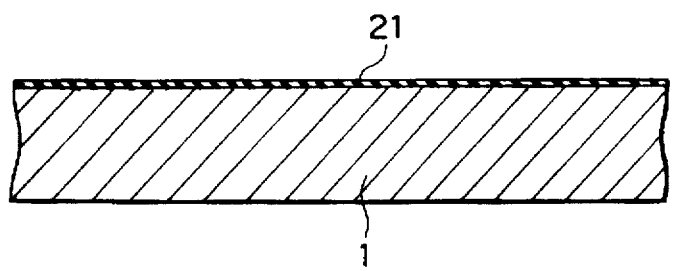
FIG. 14 is a sectional view of a first step in the manufacture of the EEPROM of FIG. 13.
Figure 15:
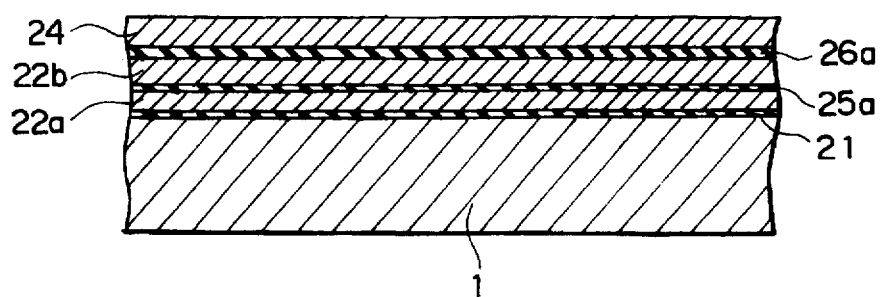
FIG. 15 is a sectional view of a second step in the manufacture of the EEPROM of FIG. 13.
Figure 16:
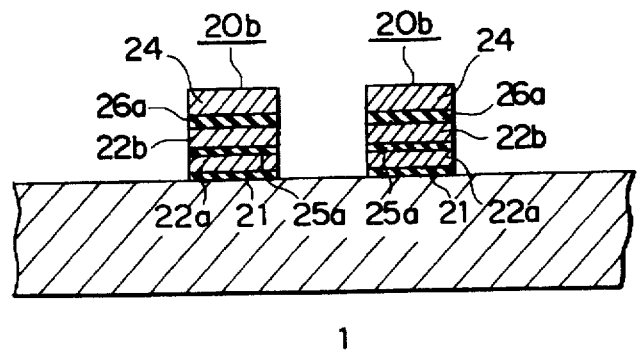
FIG. 16 is a sectional view of a third step in the manufacture of the EEPROM of FIG. 13.

FIGS. 14 to 16 are sectional views for explaining manufacture of the EEPROM 120 shown in FIG. 13. A method of manufacturing the EEPROM 120 is described with reference to these drawings.

First, as shown in FIG. 14, the first gate oxide film 21 about 10 nm thick is formed on the silicon substrate 1 by thermal oxidation. Next, as shown in FIG. 15, a polycrystalline silicon layer about 200 nm thick, which will become the first floating gate electrode 22a, the second gate oxide film 25a about 10 nm thick, a polycrystalline silicon layer about 200 nm thick, which will become the second floating gate electrode 22b, the third gate insulating film 26a about 30 nm thick, and a polycrystalline silicon layer about 300 nm thick, which will become the control gate electrode 24, are successively formed on the first gate oxide film 21 in this order.

Figure 17:
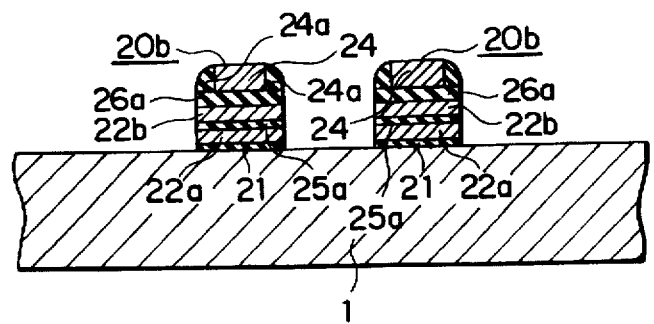
FIG. 17 is a sectional view showing a modification in which side walls are formed for a control gate electrode of the EEPROM of FIG. 13.

Then, as shown in FIG. 16, the laminated layers are patterned, using photolithography and etching techniques, into a desired pattern to form the gate electrodes 20b, each having the two-layer floating gate structure which comprises the first gate oxide film 21, the first floating gate electrode 22a, the second gate oxide film 25a, the second floating gate electrode 22b, the third gate insulating film 26a, and the control gate electrode 24. When the breakdown voltage between the erase gate electrode 28 and the control gate electrode 24 is low, side walls 24a of silicon oxide films are provided on both sides of the control gate electrode 24, as shown in FIG. 17, after patterning the control gate electrode 24.

The subsequent processing is the same as that in Embodiment 1 explained above with reference to the drawings subsequent to FIG. 6. More specifically, As ions are implanted into the silicon substrate 1 in a concentration of about $3\times10^{15}/cm^2$ with the gate electrodes 20b used as masks. After that, the implanted dopant impurities are diffused by thermal diffusion to form the source region 11 and the drain region 10. Then, the fourth gate oxide film 27 about 10 nm thick is formed on the gate electrodes 20b and on the silicon substrate 1 in the regions where the gate electrodes 20b are not present (see FIG. 7). On the fourth gate oxide film 27, a polycrystalline silicon layer about 200 nm thick, which will become the erase gate electrode 28, is formed (see FIG. 8). After that, the polycrystalline silicon layer is patterned, using photolithography and etching techniques, to form the erase gate electrode 28 (see FIG. 9).

Next, the interlayer insulating film 32 is applied over all of a device region (see FIG. 10). Then, parts of the interlayer insulating film 32 and the fourth gate oxide film 27 are removed opposite each drain region 10 to form the contact hole 33 (see FIG. 11). Subsequently, a dopant impurity producing the conductivity type opposite that of the silicon substrate 1 is implanted through each contact hole 33 to form the contact region 12 which prevents aluminum of the later-described aluminum wiring 40 from penetrating through the silicon substrate 1. The aluminum wiring 40 about 1 μm thick, which will become a bit line, is then formed in contact with the drain impurity diffusion region 10 (see FIG. 12). After that, as shown in FIG. 13, the passivation film 50 about 1 μm thick is formed for device protection, thereby completing a memory chip.

FIGS. 14 to 17 correspond to a gate electrode forming step, and the remaining relationships between the drawings and respective steps are the same as in Embodiment 1. With the manufacturing method of this embodiment, memory transistors, each having the two-layer floating gate structure, can also easily be formed by partly modifying the known manufacturing process.

Figure 18:
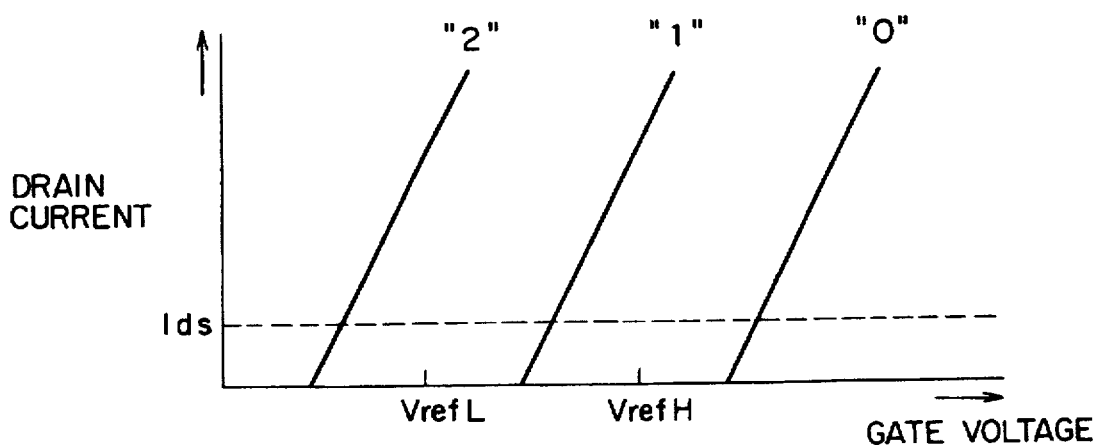
FIG. 18 is a graph for explaining reading of information from the EEPROM of the present invention.
Figure 19:
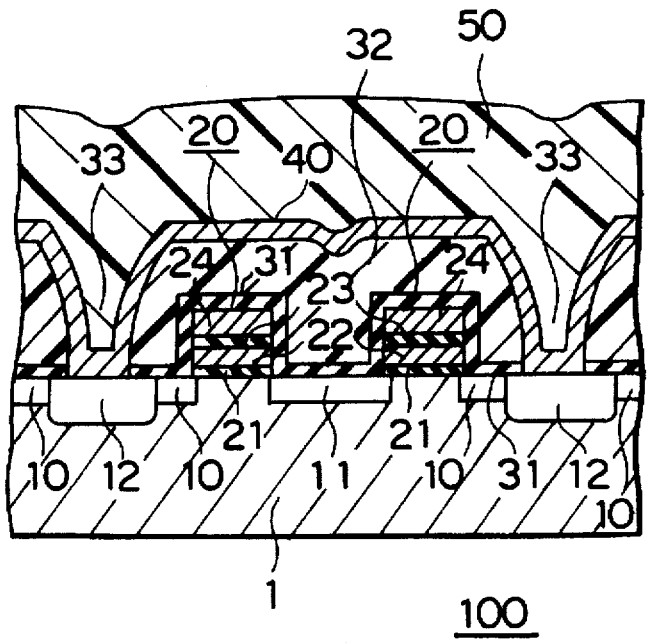
FIG. 19 is a sectional view of a known EEPROM.
Figure 20:
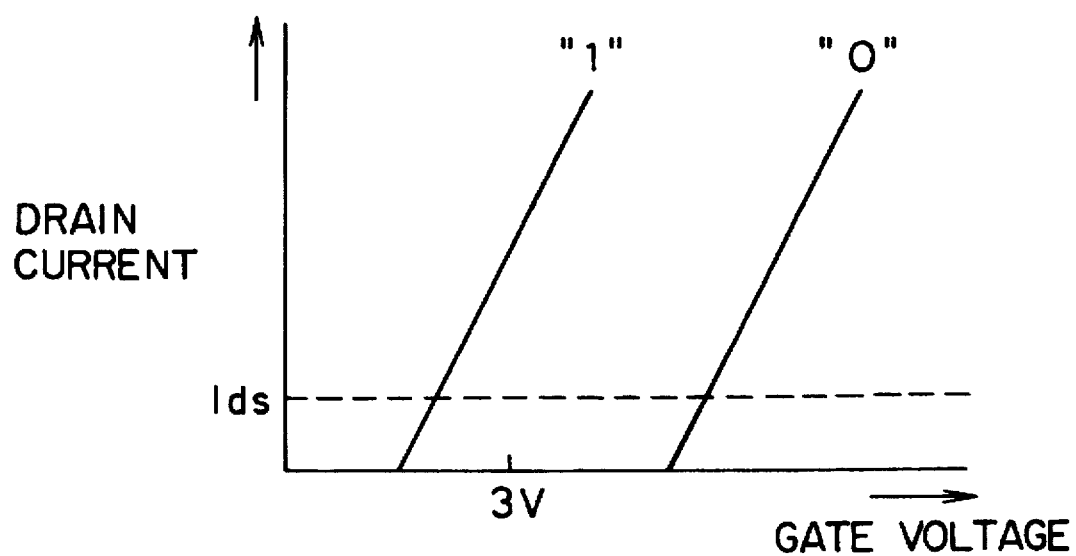
FIG. 20 is a graph for explaining reading of information from the known EEPROM.
Figure 21:
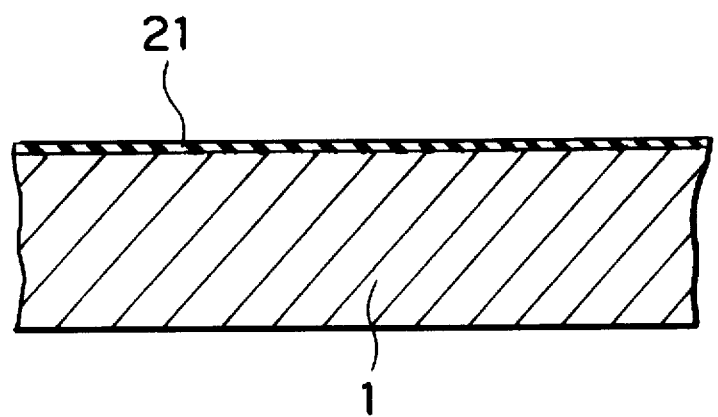
FIG. 21 is a sectional view of a first step in the manufacture of the EEPROM of FIG. 19.
Figure 22:
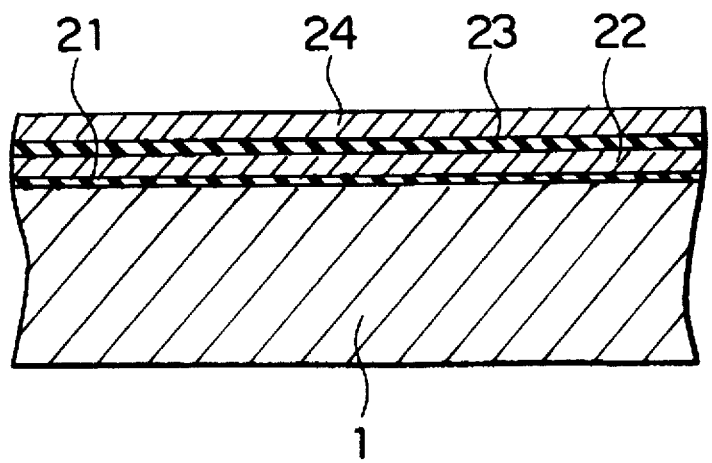
FIG. 22 is a sectional view of a second step in the manufacture of the EEPROM of FIG. 19.
Figure 23:
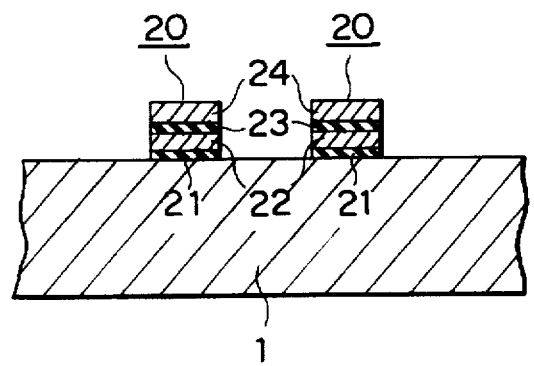
FIG. 23 is a sectional view of a third step in the manufacture of the EEPROM of FIG. 19.
Figure 24:
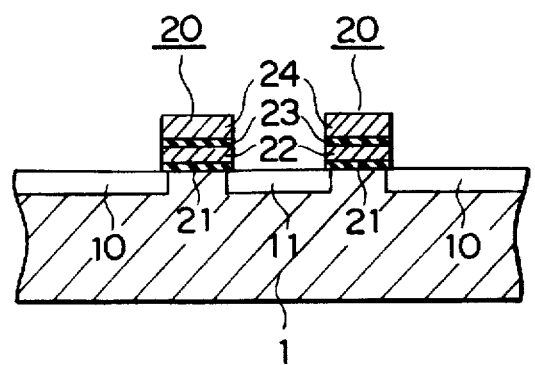
FIG. 24 is a sectional view of a fourth step in the manufacture of the EEPROM of FIG. 19.
Figure 25:
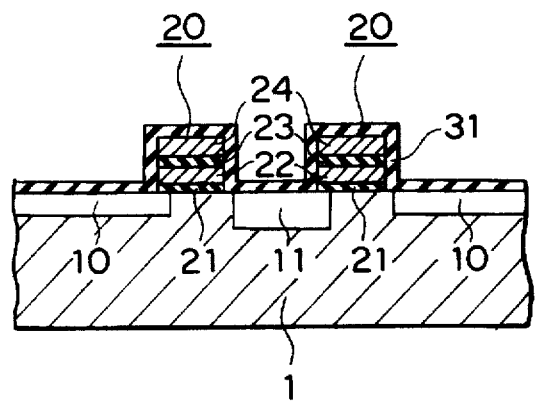
FIG. 25 is a sectional view of a fifth step in the manufacture of the EEPROM of FIG. 19.
Figure 26:
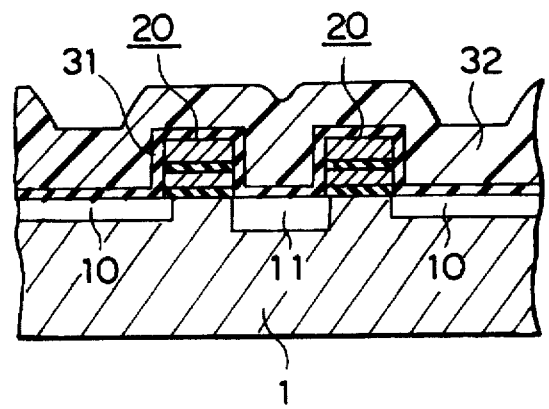
FIG. 26 is a sectional view of a sixth step in the manufacture of the EEPROM of FIG. 19.
Figure 27:
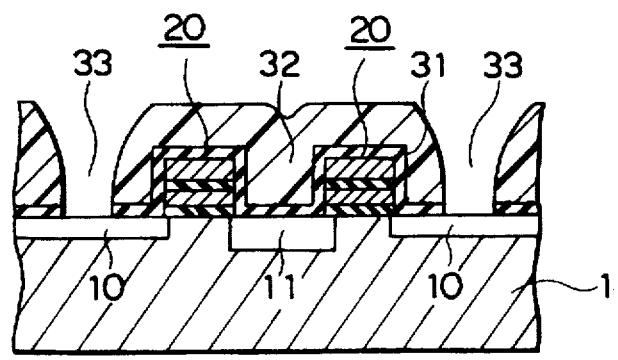
FIG. 27 is a sectional view of a seventh step in the manufacture of the EEPROM of FIG. 19.
Figure 28:
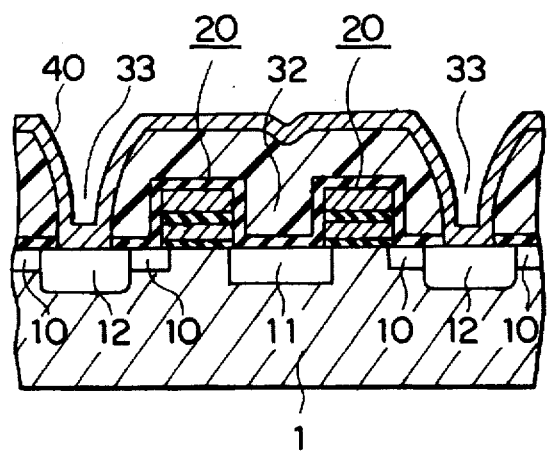
FIG. 28 is a sectional view of an eighth step in the manufacture of the EEPROM of FIG. 19.

A manner of reading information from the EEPROMs of Embodiments 1 and 2 will now be described with reference to FIG. 18. FIG. 18 shows the relationship between gate voltage and drain current for three kinds of information, "0", "1", and "2", stored in the memory transistor. As seen from FIG. 18, the three kinds of information stored in the memory transistor can be read by setting a reference drain current Ids, and also by setting a high-level reference gate voltage VrefL and a low-level reference gate voltage VrefH such that:

(1) the drain current is larger than the reference drain current Ids with the gate voltage at either of VrefL and VrefH when the information stored in the memory transistor is 2, (2) the drain current is smaller than the reference drain current Ids with the gate voltage at VrefL and is larger than the reference drain current Ids with the gate voltage at VrefH when the information stored in the memory transistor is "1", and (3) the drain current is smaller than the reference drain current Ids with the gate voltage at either of VrefL and VrefH when the information stored in the memory transistor is "0".

As described, according to the first aspect of the present invention, since the gate electrode has a two-layer floating gate structure comprising two floating gate electrodes and a control gate electrode, laminated on one another, the EEPROM can store three kinds of information, i.e., a state "1" where electrons are injected into one floating gate electrode, a state "0" where electrons are injected into the two floating gate electrodes, and a state "2" where electrons are withdrawn from the two floating gate electrodes. Accordingly, it is possible to provide a non-volatile semiconductor information storage device for storing information in a quantity much larger than in the prior art.

According to the second aspect of the present invention, since the first and second floating gate electrodes, the control gate electrode, and the insulating film and the oxide film interposed between those electrodes, which collectively make up the gate electrode, are substantially vertically laminated, the number and area of the memory transistors are not increased, making it possible to provide a non-volatile semiconductor information storage device that can store much more information while the entire size of the EEPROM, and particularly its occupied area, is kept the same as in the prior art.

According to the third aspect of the present invention, since, in the gate electrode, electrons are injected into the first and second floating gate electrodes in the same direction, and the relevant electrodes to which voltages are applied and the polarities of the voltages applied are common to the write modes, the non-volatile semiconductor information storage device has a multi-value memory in which information can be written more simply and quickly at increased operating speed, in addition to the other advantages mentioned above.

According to the fourth aspect of the present invention, a non-volatile semiconductor information storage device comprising memory transistors each having a two-layer floating gate structure can be easily formed by partly modifying a known manufacturing process. It is thus possible to provide a non-volatile semiconductor information storage device that is inexpensive and functions as a multi-value memory.

What is claimed is:

1. A non-volatile semiconductor information storage device including:

a semiconductor substrate having a first conductivity type; and a plurality of memory transistors on said semiconductor substrate, each of said memory transistors comprising:

a source region and a drain region in said semiconductor substrate and having a second conductivity type, opposite the first conductivity type, of said semiconductor substrate;

a gate electrode on said semiconductor substrate between said source region and said drain region and having, laminated in a stack successively on said semiconductor substrate, a first gate oxide film, a first floating gate electrode, a gate insulating film, a second floating gate electrode, a second gate oxide film, a control gate electrode, and a third gate oxide film so that electrons are injected into said first floating gate electrode from said semiconductor substrate through said first gate oxide film and electrons are injected into said second floating gate electrode from said control gate electrode through said second gate oxide film; and an erase gate electrode located beside said gate electrode.

2. The non-volatile semiconductor information storage device according to claim 1 wherein said gate insulating film is thicker than said second gate oxide film.

3. A non-volatile semiconductor information storage device including:

a semiconductor substrate having a first conductivity type; and a plurality of memory transistors on said semiconductor substrate, each of said memory transistors comprising:

a source region and a drain region in said semiconductor substrate and having a second conductivity type, opposite the first conductivity type, of said semiconductor substrate;

a gate electrode on said semiconductor substrate between said source region and said drain region and having, laminated in a stack successively on said semiconductor substrate, a first gate oxide film, a first floating gate electrode, a second gate oxide film, a second floating gate electrode, a gate insulating film, a control gate electrode, and a third gate oxide film so that electrons are injected into said first floating gate electrode from said semiconductor substrate through said first gate oxide film and electrons are injected into said second floating gate electrode from said first floating gate electrode through said second gate oxide film; and an erase gate electrode located beside said gate electrode.

4. The non-volatile semiconductor information storage device according to claim 3 wherein said gate insulating film is thicker than said second gate oxide film.

* * * * *